(12) United States Patent
Sugibayashi

(10) Patent No.: US 12,306,050 B2
(45) Date of Patent: May 20, 2025

(54) PRESSURE SENSOR DEVICE, PRESSURE SENSOR MODULE, AND SIGNAL CORRECTION METHOD FOR PRESSURE SENSOR MODULE

(71) Applicant: Murata Manufacturing Co., Ltd., Nagaokakyo (JP)

(72) Inventor: Hideaki Sugibayashi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 192 days.

(21) Appl. No.: 18/086,710

(22) Filed: Dec. 22, 2022

(65) Prior Publication Data

US 2023/0130920 A1    Apr. 27, 2023

Related U.S. Application Data

(63) Continuation of application No. PCT/JP2021/022241, filed on Jun. 11, 2021.

(30) Foreign Application Priority Data

Jul. 6, 2020 (JP) ................. 2020-116547

(51) Int. Cl.
*G01L 1/14* (2006.01)
*G01L 25/00* (2006.01)
*H05K 1/18* (2006.01)

(52) U.S. Cl.
CPC ............. *G01L 1/144* (2013.01); *G01L 25/00* (2013.01); *H05K 1/181* (2013.01); *H05K 2201/10151* (2013.01)

(58) Field of Classification Search
CPC ....... G01L 1/144; G01L 25/00; G01L 27/002; G01L 9/0073; G01L 9/12; G01L 19/04; H05K 1/181; H05K 2201/10151
See application file for complete search history.

(56) References Cited

U.S. PATENT DOCUMENTS 5,561,247 A * 10/1996 Mutoh ................. G01L 9/0075
73/723
5,965,821 A * 10/1999 Grudzien ............. G01L 9/0072
73/718
6,122,973 A *  9/2000 Nomura ............... G01L 9/0075
361/283.4

FOREIGN PATENT DOCUMENTS

| CN | 110168335 A | 8/2019 |
| JP | 0961273 A | 3/1997 |
| JP | 2815279 B2 | 10/1998 |

OTHER PUBLICATIONS

International Search Report in PCT/JP2021/022241, mailed Jul. 6 2021, 3 pages.

(Continued)

*Primary Examiner* — Xin Y Zhong
(74) *Attorney, Agent, or Firm* — Keating & Bennett, LLP

(57) ABSTRACT

A pressure sensor device includes an electrically insulative substrate, a base electrode layer, spacer portions, a guard electrode layer, and a membrane plate. A sensing electrode portion and monitoring electrode portions are located on the membrane plate and face the substrate. In a case where the monitoring electrodes are mounted on a circuit board, the monitoring electrodes detect at least one of stress or strain occurring in or on the spacer portions.

16 Claims, 6 Drawing Sheets

(56) References Cited

OTHER PUBLICATIONS

Written Opinion in PCT/JP2021/022241, mailed Jul. 6, 2021, 3 pages.
Official Communication issued in corresponding Chinese Patent Application No. 202180048158.4, mailed on Mar. 5, 2025, 9 pages.

* cited by examiner

PRESSURE SENSOR DEVICE, PRESSURE SENSOR MODULE, AND SIGNAL CORRECTION METHOD FOR PRESSURE SENSOR MODULE

CROSS REFERENCE TO RELATED APPLICATIONS

This application claims the benefit of priority to Japanese Patent Application No. 2020-116547 filed on Jul. 6, 2020 and is a Continuation Application of PCT Application No. PCT/JP2021/022241 filed on Jun. 11, 2021. The entire contents of each application are hereby incorporated herein by reference.

BACKGROUND OF THE INVENTION

1. Field of the Invention

The present invention relates to a pressure sensor device for measuring pressure such as atmospheric pressure or water pressure and a pressure sensor module including the same. The present invention also relates to a signal correction method for a pressure sensor module.

2. Description of the Related Art

Pressure sensors can be manufactured using micro electrical and mechanical system (MEMS) technology to which semiconductor manufacturing technology is applied, and, for example, a microminiature sensor about 0.5 mm to 2 mm square can be realized. A typical pressure sensor has a capacitor structure having two electrodes, and the pressure can be measured in such a manner that a capacitance change attributable to an ambient pressure change is detected.

FIG. 10 is a cross-sectional view illustrating an example of a pressure sensor device in the related art. The pressure sensor device includes a conductive substrate 91 that functions as a base electrode, a membrane 95 that functions as a sensing electrode, and a spacer portion for keeping a gap G between the substrate 91 and the membrane 95. The spacer portion includes a guard electrode layer 93 and electrical insulating layers 92 and 94 disposed one above the other.

In a case where capacitance between the substrate 91 and the membrane 95 is measured, a positive voltage or a negative voltage is applied between a base terminal TB and a sensing terminal TS periodically, generated charges are taken out, analog/digital (A/D) conversion is performed of the charges, linearity and temperature characteristics are then corrected by digital operation, and the capacitance is converted into an appropriate pressure value.

In Japanese Unexamined Patent Application Publication No. 9-61273, a substantially C-shaped reference capacitor electrode 6 is disposed outward of a circular main capacitor electrode 5, an insulative spacer 3b is provided between the reference capacitor electrode 6 and the main capacitor electrode 5, and thereby the reference capacitor electrode 6 is prevented from being deformed.

Typically, after being manufactured and shipped from a factory, a pressure sensor device illustrated in FIG. 10 is mounted on the circuit board by soldering such as reflow on the product assembly line. In this case, heat is applied in the mounting, and stress and/or strain occurs in or on the package or the sensor itself. As the result, for example, an approximately 100 Pa shift from an initial value occurs as an output offset of the pressure sensor on occasions and thus causes a measurement error.

SUMMARY OF THE INVENTION

Preferred embodiments of the present invention provide pressure sensor devices that each enable high measurement accuracy to be achieved even after being mounted on a circuit board and pressure sensor modules including such pressure sensor devices. Preferred embodiments of the present invention also provide signal correction methods for pressure sensor modules each enabling high measurement accuracy to be achieved even after being mounted on a circuit board.

According to a preferred embodiment of the present invention, a pressure sensor device to detect a change in capacitance between electrodes includes a base electrode portion, a sensing electrode portion defining a sensing capacitor together with the base electrode portion and that is deformable in response to an ambient pressure difference, a spacer maintaining a gap between the base electrode portion and the sensing electrode portion, and a monitoring electrode portion defining a monitoring capacitor together with the base electrode portion to detect at least one of stress or strain occurring in or on the spacer.

According to a preferred embodiment of the present invention, a pressure sensor module includes a pressure sensor device according to a preferred embodiment of the present invention, and an integrated circuit to process an output signal from the pressure sensor device, and the integrated circuit includes a switching circuit to perform switching between a sensing signal from the sensing electrode portion and a monitoring signal from the monitoring electrode, an A/D converter to convert an output signal from the switching circuit to a digital signal, a digital signal processor to perform signal processing on the digital signal, and a memory or a register to store a digital value of the monitoring signal.

According to a preferred embodiment of the present invention, a signal correction method for a pressure sensor module includes before mounting the pressure sensor module on a circuit board, measuring a capacitance of the monitoring capacitor and storing the capacitance as an initial capacitance value in the memory or the register, after mounting the pressure sensor module on the circuit board, measuring a capacitance of the monitoring capacitor and storing the capacitance as a post-mounting capacitance value in the memory or the register, calculating a strain correction coefficient based on the initial capacitance value and the post-mounting capacitance value, and measuring capacitance of the sensing capacitor, and correcting the capacitance by using the strain correction coefficient, and thereafter converting the capacitance into a pressure value.

According to preferred embodiments of the present invention, high measurement accuracy can be achieved even after mounting on the circuit board.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
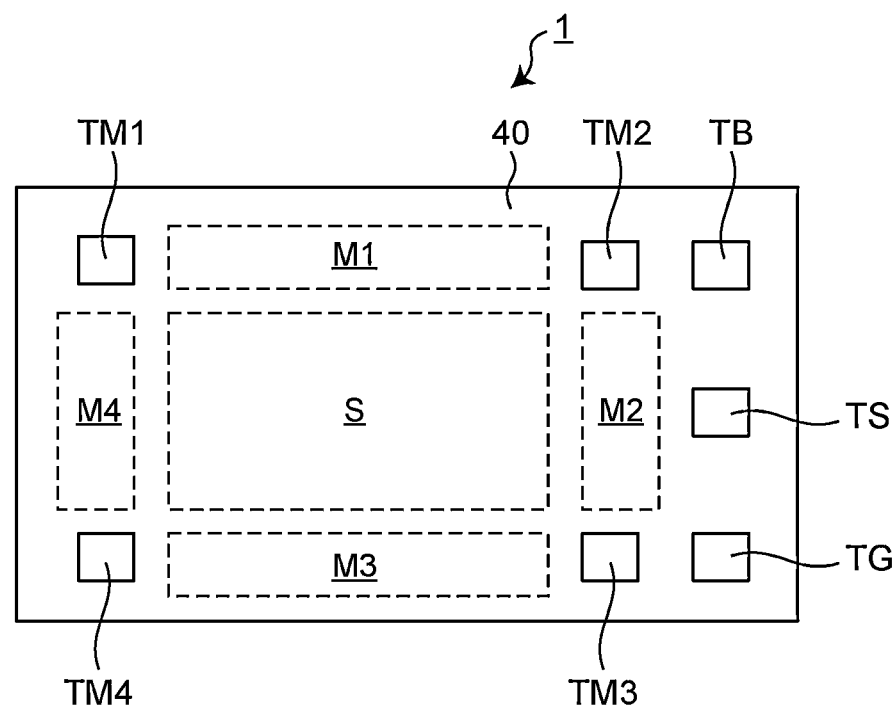
FIG. 1A is a plan view illustrating an example of a pressure sensor device according to Preferred Embodiment 1 of the present invention.

According to a preferred embodiment of the present invention, a pressure sensor device to detect a change in capacitance between electrodes includes a base electrode portion, a sensing electrode portion defining a sensing capacitor together with the base electrode portion and that is deformable in response to an ambient pressure difference, a spacer maintaining a gap between the base electrode portion and the sensing electrode portion, and a monitoring electrode portion defining a monitoring capacitor together with the base electrode portion to detect at least one of stress or strain occurring in or on the spacer.

According to this configuration, the monitoring electrode portion can detect the stress and/or strain applied to the spacer. Accordingly, even if the capacitance of the sensing capacitor is changed due to thermal stress, for example, during soldering when the pressure sensor device is mounted on the circuit board, considering the change in the capacitance before and after the mounting of the monitoring capacitor enables the capacitance of the sensing capacitor to be corrected to an appropriate value. As the result, a highly accurate pressure value can be measured in the state of assembly into a final product.

The sensing electrode portion preferably includes a sensing electrode that is rectangular or oblong in a plan view, and the monitoring electrode portion preferably includes first, second, third, and fourth monitoring electrodes that are respectively provided in left, right, upper, and lower outer side portions of the sensing electrode.

According to this configuration, the first, second, third, and fourth monitoring electrodes can individually detect the stress and/or strain occurring in the left, right, upper, and lower outer side portions of the sensing electrode. The stress and/or strain state can thus be detected more correctly.

The sensing electrode portion preferably includes a sensing electrode that is rectangular or oblong in a plan view, and the monitoring electrode portion preferably includes first and second monitoring electrodes that are respectively provided in left and right outer side portions or in upper and lower outer side portions of the sensing electrode.

According to this configuration, the first and second monitoring electrodes can individually detect the stress and/or strain occurring in the left and right outer side portions or in the upper and lower outer side portions of the sensing electrode. The stress and/or strain state can thus be detected more accurately in a simplified configuration.

A monitoring gap included in the monitoring capacitor is preferably isolated from a sensing gap included in the sensing capacitor, from a fluid viewpoint.

According to this configuration, mutual influence between the capacitance measurement of the monitoring capacitor and the capacitance measurement of the sensing capacitor can be reduced.

According to another preferred embodiment of the present invention, a pressure sensor module includes the pressure sensor device described above, and an integrated circuit to process an output signal from the pressure sensor device, and the integrated circuit includes a switching circuit to perform switching between a sensing signal from the sensing electrode portion and a monitoring signal from the monitoring electrode portion, an A/D converter to convert an output signal from the switching circuit to a digital signal, a digital signal processor to perform signal processing on the digital signal, and a memory or a register to store a digital value of the monitoring signal.

According to this configuration, high measurement accuracy can be achieved even after the mounting on the circuit board. In addition, the signal processing is available in the module, and thus load on the external host can be reduced.

According to another preferred embodiment of the present invention, a signal correction method for the pressure sensor module described above includes before mounting the pressure sensor module on a circuit board, measuring a capacitance of the monitoring capacitor and storing the capacitance as an initial capacitance value in the memory or the register; after mounting the pressure sensor module on the circuit board, measuring a capacitance of the monitoring capacitor and storing the capacitance as a post-mounting capacitance value in the memory or the register, calculating a strain correction coefficient on a basis of the initial capacitance value and the post-mounting capacitance value, and measuring a capacitance of the sensing capacitor, and correcting the capacitance by using the strain correction coefficient, and thereafter converting the capacitance into a pressure value.

According to this configuration, the strain correction coefficient is calculated based on the initial capacitance value before the mounting on the circuit board and the post-mounting capacitance value after the mounting. The high measurement accuracy can thus be achieved even after the mounting on the circuit board. In addition, the signal processing is performed in the module, and thus the load on the external host can be reduced.

Preferred Embodiment 1

Figure 1B:
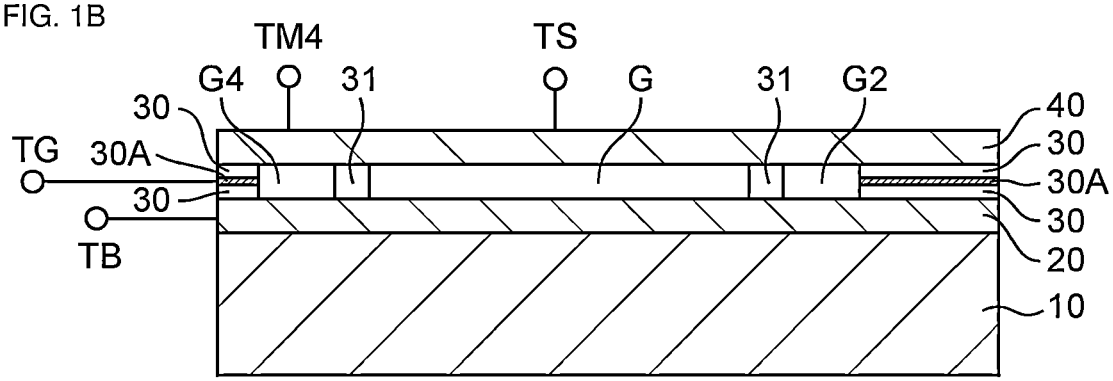
FIG. 1B is a cross-sectional view thereof.

FIG. 1A is a plan view illustrating an example of a pressure sensor device 1 according to Preferred Embodiment 1 of the present invention, and FIG. 1B is a cross-sectional view thereof.

The pressure sensor device 1 includes an electrically insulative substrate 10, a base electrode layer 20, spacer portions 30 and 31, a guard electrode layer 30A, a membrane plate 40, and other components.

The substrate 10 is made of, for example, an electrically insulative material such as silicon oxide. The base electrode layer 20 is provided on one side, that is, a main surface side of the substrate 10. The base electrode layer 20 defines and functions as a base electrode portion that is a common electrode of the device 1 and is made of a conductive material such as, for example, polycrystalline Si, amorphous Si, or single crystal Si (having low resistivity). Alternatively, the substrate 10 may be made of, for example, a conductive material and define and function as the base electrode portion. In this case, the base electrode layer 20 is not required.

The membrane plate 40 is made of an electrically insulative material such as, for example, silicon oxide or single crystal silicon, and a sensing electrode S and monitoring electrodes M1 to M4 are provided on the lower surface of the membrane plate 40 so as to face the substrate 10. On the upper surface of the membrane plate 40, a sensing terminal TS, a base terminal TB, a guard terminal TG, and monitoring terminals TM1 to TM4 are provided. The sensing terminal TS is electrically connected to the sensing electrode S, the base terminal TB is electrically connected to the upper surface of the base electrode layer 20, the guard terminal TG is electrically connected to the guard electrode layer 30A, and the monitoring terminals TM1 to TM4 are electrically connected to the monitoring electrodes M1 to M4, respectively.

The sensing electrode S is, for example, rectangular or substantially rectangular in a plan view and, as the sensing electrode portion, defines a sensing capacitor together with the upper surface of the base electrode layer 20. Capacitance Cs between electrodes is expressed as $Cs = \varepsilon \times S/d$ by using a dielectric constant $\varepsilon$ of a gap G, an electrode area S, and a distance between electrodes d. When the membrane plate 40 is elastically deformed in response to a pressure difference between the outside and the gap G, the distance between electrodes d is changed due to the displacement of the sensing electrode S, and the capacitance Cs is also changed in response to this. The change of the capacitance Cs is detected by an external circuit with the sensing terminal TS interposed therebetween.

The spacer portions 30 and 31 are made of an electrically insulative material such as, for example, silicon oxide and are provided to maintain the gap G between the sensing electrode S and the substrate 10 and gaps G1 to G4 between the substrate 10 and the monitoring electrodes M1 to M4. Note that FIG. 1B illustrates only the gaps G2 and G4. The spacer portion 30 is provided along the perimeter of the substrate 10 airtightly so as to seal the gap G and the gaps G1 to G4. The spacer portion 31 is provided along the perimeter of the sensing electrode S airtightly so as to seal the gap G and the gaps G1 to G4. The gap G and the gaps G1 to G4 are spaces sealed from the outside and isolated from (do not communicate with) each other, from a fluid viewpoint. For example, an inert gas may be filled therein, and a constant pressure is maintained. Alternatively, a dielectric material may be filled therein.

The guard electrode layer 30A is provided inside the spacer portion 30. That is, the guard electrode layer 30A is provided along the perimeter of the substrate 10 and is electrically insulated from the base electrode layer 20 and the membrane plate 40 by the spacer portion 30. The presence of the spacer portion 30 between the base electrode layer 20 and the membrane plate 40 causes the occurrence of stray capacitance irrelevant to a pressure change. However, the stray capacitance can be cancelled by electrically grounding the guard electrode layer 30A with the guard terminal TG interposed therebetween.

The monitoring electrodes M1 to M4 are, for example, rectangular or substantially rectangular in the plan view and, as the monitoring electrode portions, define monitoring capacitors together with the substrate 10. The width of each of the gaps G1 to G4 is narrower than the width of the gap G and accounts for, for example, about ¼ to about ¹⁄₁₀. Accordingly, even if the membrane plate 40 is elastically deformed in response to a pressure difference between the external environment and the gap G, the monitoring electrodes M1 to M4 are not displaced. The gaps G1 to G4 may be filled with a dielectric having a dielectric constant different from that of the gap G, for example, solid polymer, and this can prevent the deformation of the monitoring electrodes M1 to M4 more.

In a case where the pressure sensor device 1 is mounted on the circuit board by soldering such as reflow, at least one of stress or strain occurs in or on the spacer portions 30 and 31 due to heat and causes a slight change in the distance between electrodes d on occasions. At this time, capacitances Cd1 to Cd4 of the respective monitoring capacitors corresponding to the monitoring electrodes M1 to M4 are changed in accordance with at least one of stress or strain distribution, and thus the stress and/or strain occurring in or on the spacer portion 31 can be detected. The changes of the respective capacitances Cd1 to Cd4 are detected by an external circuit with the monitoring terminals TM1 to TM4 interposed therebetween.

Figure 2:
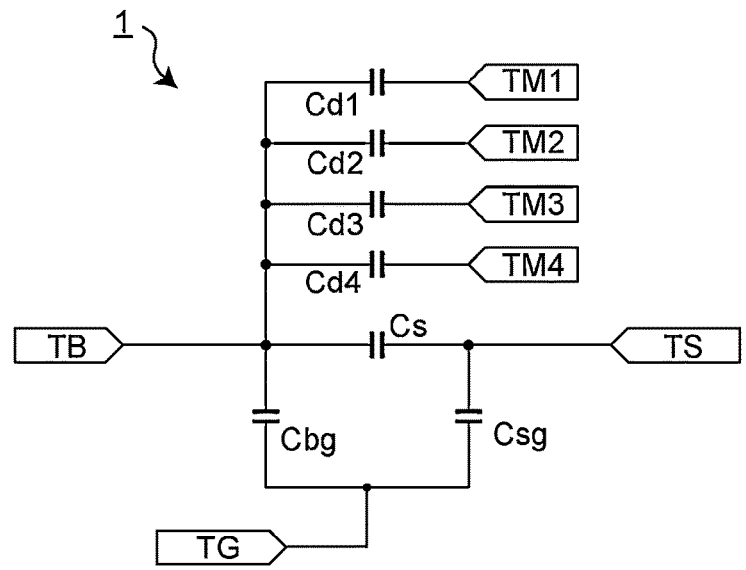
FIG. 2 is an equivalent circuit diagram of the pressure sensor device illustrated in FIGS. 1A and 1B.
Figure 3:
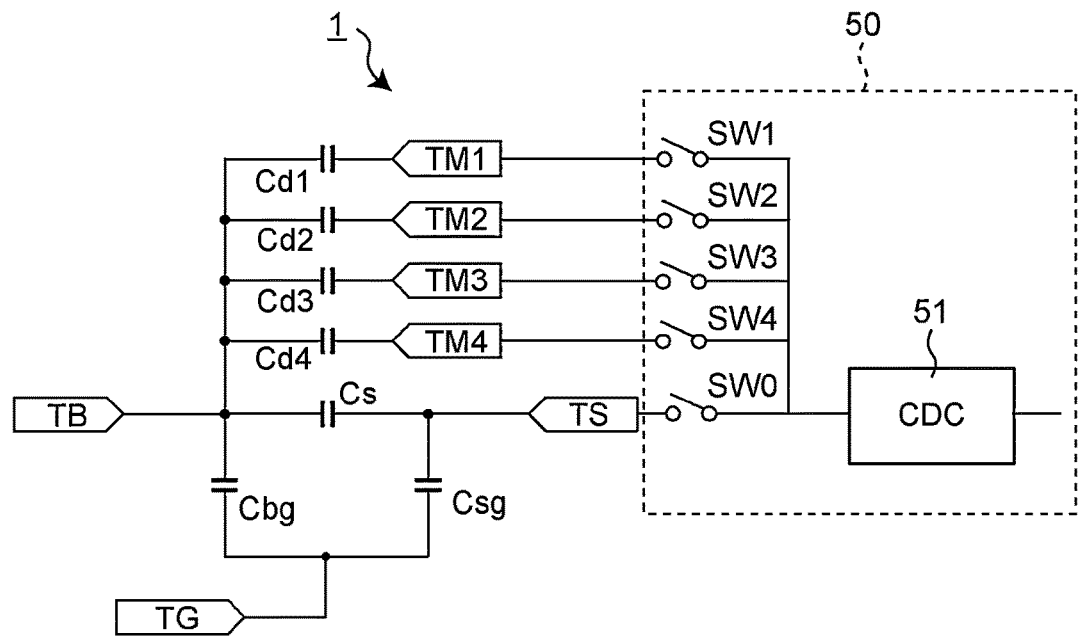
FIG. 3 is a circuit diagram illustrating electrical connection between the pressure sensor device and an integrated circuit.

FIG. 2 is an equivalent circuit diagram of the pressure sensor device 1 illustrated in FIGS. 1A and 1B. FIG. 3 is a circuit diagram illustrating electrical connection between the pressure sensor device 1 and an integrated circuit 50. The sensing capacitor including the capacitance Cs is present between the base terminal TB and the sensing terminal TS. The monitoring capacitors respectively including the capacitances Cd1 to Cd4 are present between the base terminal TB and the monitoring terminals TM1 to TM4. Stray capacitance Cbg is present between the base terminal TB and the guard terminal TG. Stray capacitance Csg is present between the sensing terminal TS and the guard terminal TG.

As illustrated in FIG. 3, switching circuits SW0 to SW4 and a CDC circuit 51 are provided in the integrated circuit 50 (CDC is short for Capacitance to Digital Convertor). The switching circuits SW0 to SW4 operate as a multiplexer that selects an output signal from a plurality of input signals at predetermined timing. Specifically, a) in a case where SW0 is on and SW1 to SW4 are off, the capacitance Cs can be detected. b) In a case where SW1 is on and SW0 and SW2 to SW4 are off, the capacitance Cd1 can be detected. c) In a case where SW2 is on and SW0, SW1, SW3, and SW4 are off, the capacitance Cd2 can be detected. d) In a case where SW3 is on and SW0 to SW2 and SW4 are off, the capacitance Cd3 can be detected. e) In a case where SW4 is on and SW0 to SW3 are off, the capacitance Cd4 can be detected.

The CDC circuit 51 includes an A/D converter that converts an analog signal to a digital signal and converts the capacitance selected by one of the switching circuits SW0 to SW4 into a digital signal. A pulse generator that supplies the capacitance with a square wave voltage and an amplifier that amplifies charges generated from the capacitance are provided between the CDC circuit 51 and the switching circuits SW0 to SW4. However, these are not illustrated in FIG. 3.

Figure 4:
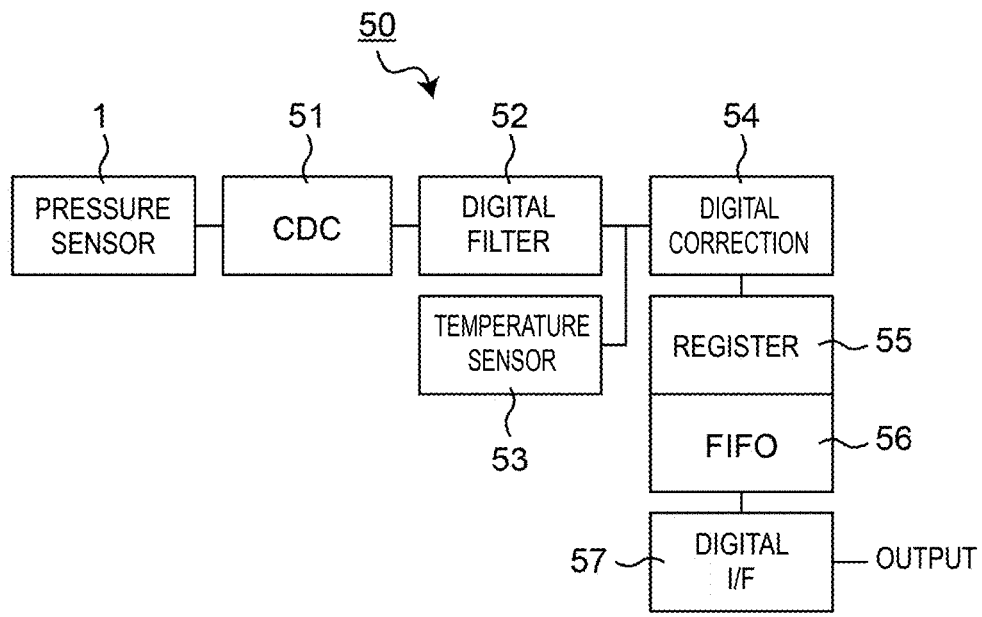
FIG. 4 is a block diagram illustrating an example of the integrated circuit.

FIG. 4 is a block diagram illustrating an example of the integrated circuit 50. The integrated circuit 50 includes, for example, an ASIC, a FPGA, a PLD, or a CPLD and includes the CDC circuit 51 described above, a digital filter 52, a temperature sensor 53, a digital corrector 54, a register 55, a FIFO buffer 56, and a digital interface (I/F) 57. These are provided by, for example, a combination of an arithmetic processor such as a CPU or a GPU, a memory such as an EEPROM or a RAM, software, and hardware.

The digital filter 52 performs filtering on a digital signal from the CDC circuit 51 to eliminate a high frequency noise component and outputs a signal in a low frequency band. The temperature sensor 53 includes, for example, a P-N junction diode, a thermistor, and the like, measures the temperature near the pressure sensor device 1, and outputs a digital value of the temperature.

The digital corrector 54 corrects the digital pressure value output from the digital filter 52 by using the digital temperature value from the temperature sensor 53 and a correction coefficient stored in the internal memory and performs temperature correction and linearity correction. The register 55 stores various pieces of digital data. The FIFO buffer 56 temporarily stores digital data to control input and output timing. The digital I/F 57 communicates with an external host and thus transmits and receives the various pieces of digital data.

The pressure sensor module includes the pressure sensor device 1 and the integrated circuit 50.

Figure 5:
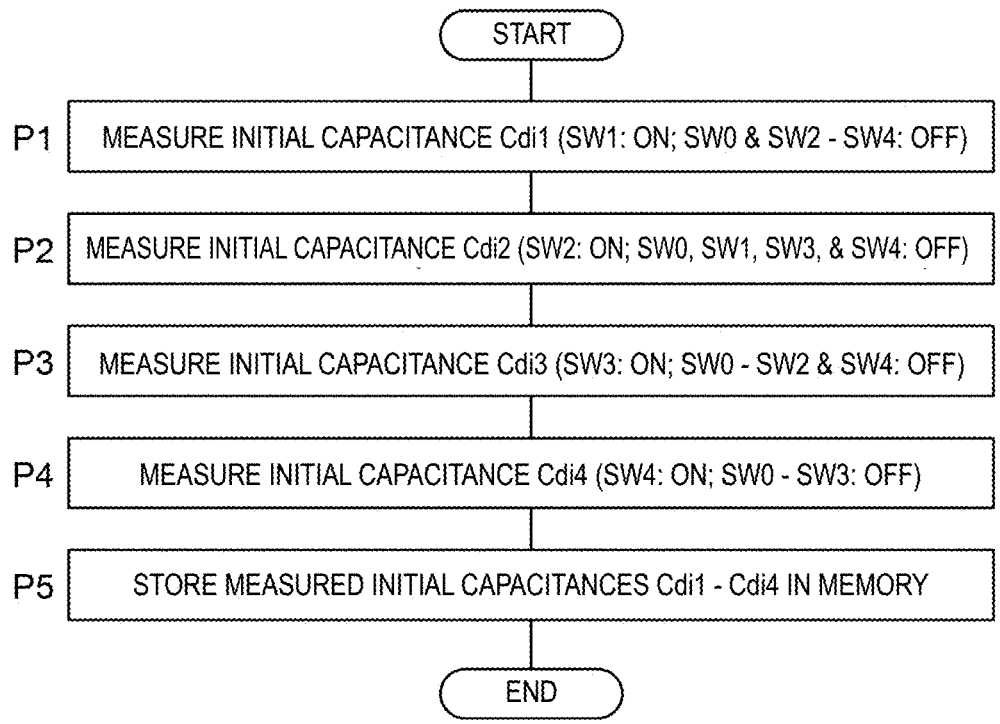
FIG. 5 is a flowchart illustrating an example of an operation sequence of the integrated circuit at a manufacturing stage.

FIG. 5 is a flowchart illustrating an example of an operation sequence of the integrated circuit 50 at the manufacturing stage. The sequence like this can be automatically provided, for example, by being programmed in a state machine (digital circuit that automatically controls operation steps) in the ASIC. The initial values of the respective capacitances Cd1 to Cd4 of the monitoring capacitors corresponding to the monitoring electrodes M1 to M4 are herein measured.

First, in step P1, an initial capacitance Cdi1 is measured with the switching circuit SW1 turned on and the switching circuits SW0 and SW2 to SW4 turned off. Next, in step P2, an initial capacitance Cdi2 is measured with the switching circuit SW2 turned on and the switching circuits SW0, SW1, SW3, and SW4 turned off.

Next, in step P3, an initial capacitance Cdi3 is measured with the switching circuit SW3 turned on and the switching circuits SW0 to SW2 and SW4 turned off. Next, in step P4, an initial capacitance Cdi4 is measured with the switching circuit SW4 turned on and the switching circuits SW0 to SW3 turned off.

Next, in step P5, the measured initial capacitances Cdi1 to Cdi4 are stored in the non-volatile memory or the register of the integrated circuit 50, for example, in the EEPROM. At this stage, the pressure sensor module is ready for shipping.

Figure 6:
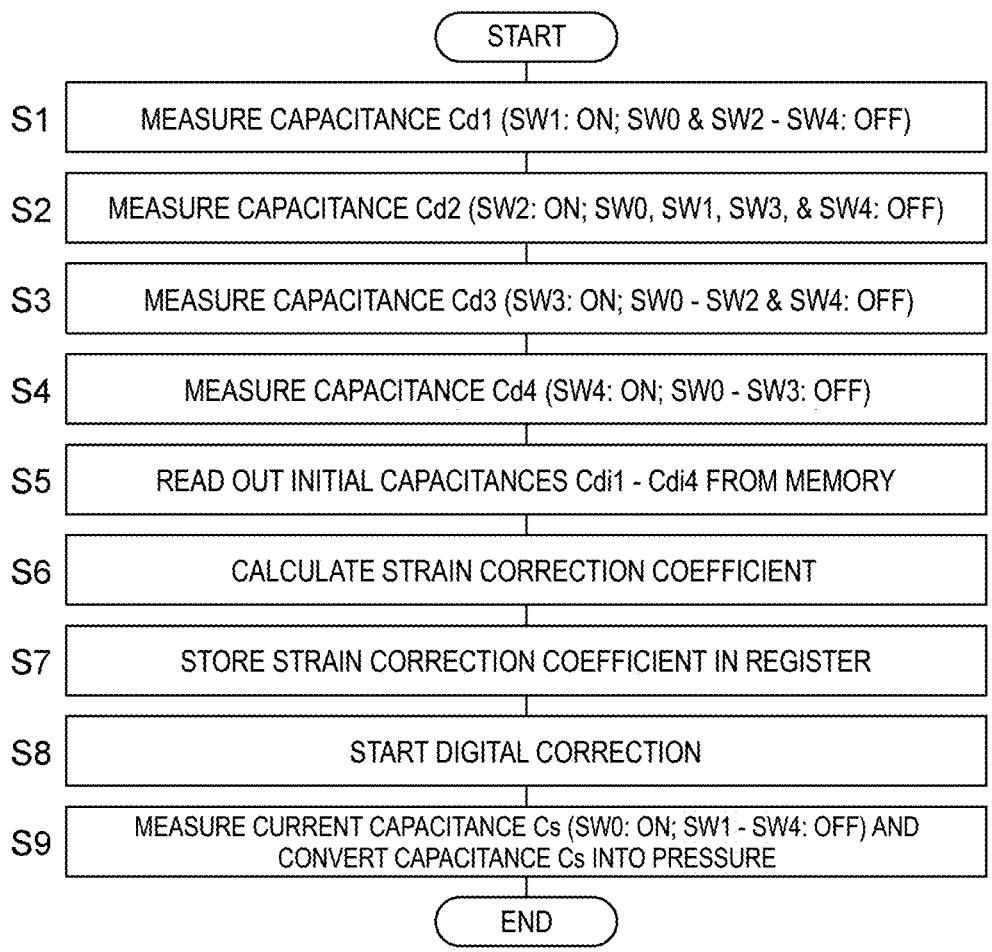
FIG. 6 is a flowchart illustrating an example of an operation sequence of the integrated circuit after being mounted on the circuit board.

FIG. 6 is a flowchart illustrating an example of an operation sequence of the integrated circuit 50 after mounting on the circuit board. The sequence like this can be provided automatically, for example, by being programmed in the state machine in the ASIC and is started after the integrated circuit 50 is powered on or in response to receiving a control command from the external host. Data correction is herein performed by using the initial capacitances Cdi1 to Cdi4 measured at the manufacturing stage.

First, in step S1, the capacitance Cd1 after the mounting is measured with the switching circuit SW1 turned on and the switching circuits SW0 and SW2 to SW4 turned off and is stored in the memory or the register. Next, in step S2, the capacitance Cd2 after the mounting is measured with the switching circuit SW2 turned on and the switching circuits SW0, SW1, SW3, and SW4 turned off and is stored in the memory or the register.

Next, in step S3, the capacitance Cd3 after the mounting is measured with the switching circuit SW3 turned on and the switching circuits SW0 to SW2 and SW4 turned off and is stored in the memory or the register. Next, in step S4, the capacitance Cd4 after the mounting is measured with the switching circuit SW4 turned on and the switching circuits SW0 to SW3 turned off and is stored in the memory or the register.

Next, in step S5, the initial capacitances Cdi1 to Cdi4 stored in the memory or the register of the integrated circuit 50 in step P5 are read out. Next, in step S6, a strain correction coefficient is calculated based on the initial capacitances Cdi1 to Cdi4 and the capacitances Cd1 to Cd4 after the mounting that are measured in steps S1 to S4.

Next, in step S7, the obtained strain correction coefficient is stored in the digital correction part 54. Next, in step S8, digital correction is started.

Next, in step S9, the current capacitance Cs is measured with the switching circuit SW0 turned on and the switching circuits SW1 to SW4 turned off and is converted into pressure corrected by using the strain correction coefficient.

In an example, a specific method for calculating the strain correction coefficient will be described. First, a difference $\Delta Cdn = Cdn - Cdin$ ($n=1, 2, 3, 4$) is calculated. Next, capacitance variations in the X direction/Y direction are calculated from differences between the capacitances Cd1 and Cd3 provided across the sensing electrode S and between the capacitances Cd2 and Cd4 provided across the sensing electrode S. Next, displacements dx and dy of the gaps G1 to G4 in the X direction/Y direction are calculated by using the expression for a capacitor "$C=\varepsilon \times S/d$" to derive a pressure variation $P_{offset}$ below. Note that $\alpha$ is a strain constant for the X direction, and $\beta$ is a strain constant for the Y direction.

$$P_{offset} = \alpha \times dx + \beta \times dy \quad (1)$$

All of the capacitance values are stored as digitized data in the memory or the register of the integrated circuit. In addition, the temperature value from the temperature sensor 53 is also digitized and thus is usable as the temperature data. The temperature characteristics and the linearity are polynomially calculated together with the correction coefficient obtained at the manufacturing stage in advance, and final output p(L, T) below is obtained. Note that $a_{ij}$ is a correction coefficient for the temperature/linearity, f(L) is a function for the linearity, and f(T) is a function for the temperature.

$$p(L,T) = \Sigma[a_{ij} \cdot f(L) \cdot f(T)] \quad (2)$$

A final pressure value $P_{final}$ is obtained in such a manner that the pressure variation $P_{offset}$ obtained in the previous step is subtracted from Formula (2) to consider the stress and/or strain correction.

$$P_{final} = p(L,T) - P_{offset} \quad (3)$$

These correction calculations can be performed in the digital corrector 54 in FIG. 4 in synchronization with the internal clock.

Preferred Embodiment 2

Figure 7:
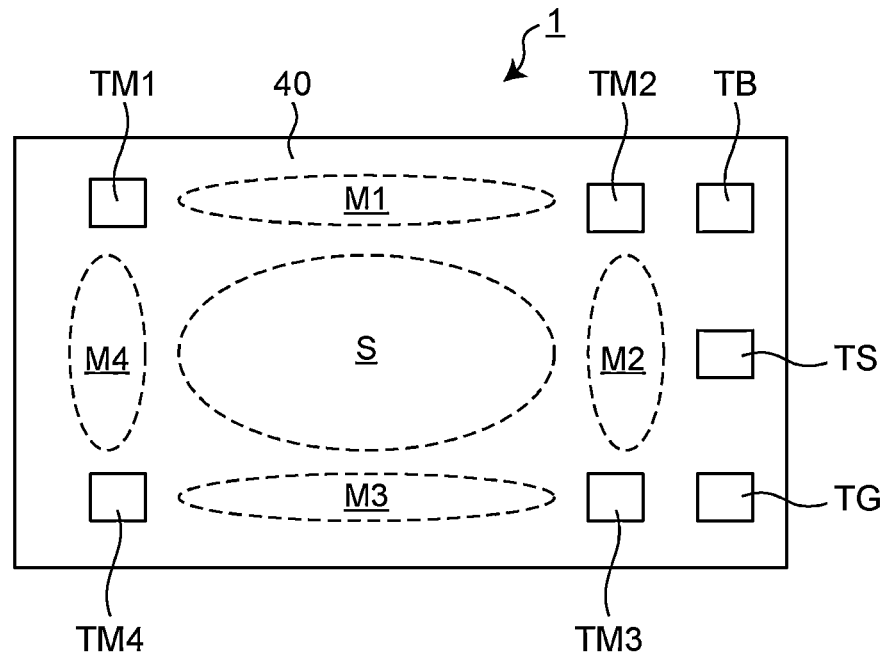
FIG. 7 is a plan view illustrating an example of a pressure sensor device 1 according to Preferred Embodiment 2 of the present invention.

FIG. 7 is a plan view illustrating an example of a pressure sensor device 1 according to Preferred Embodiment 2 of the present invention. In this preferred embodiment, as compared with the configuration in FIGS. 1A and 1B, the sensing electrode S is oblong (or elliptical) in a plan view, and the monitoring electrodes M1 to M4 are also oblong in the plan view. The mechanical and electrical configurations except these are the same or substantially the same as those in FIGS. 1A and 1B. With the configuration like this, the monitoring electrodes M1 to M4 can also detect the stress and/or strain applied to the spacer portion.

Preferred Embodiment 3

Figure 8:
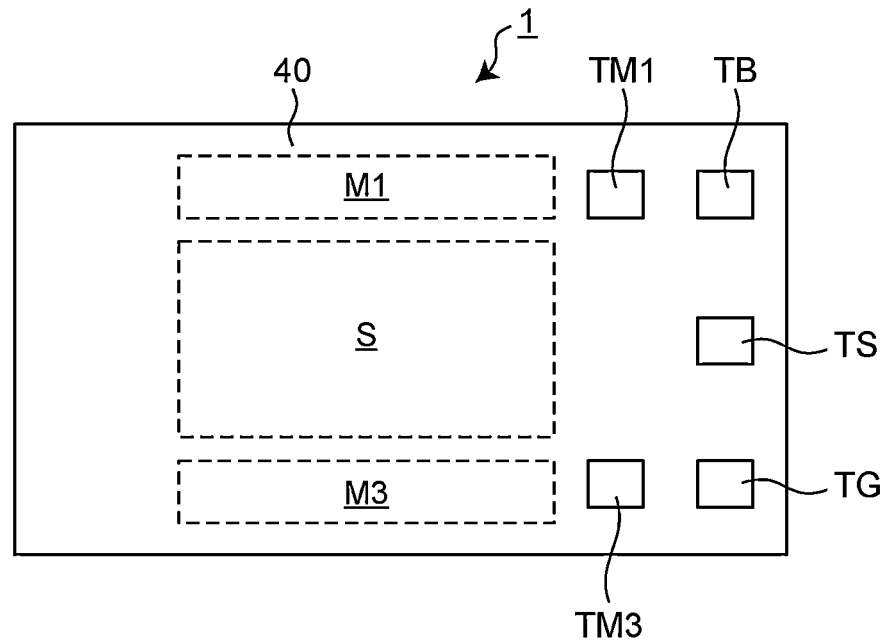
FIG. 8 is a plan view illustrating an example of a pressure sensor device 1 according to Preferred Embodiment 3 of the present invention.

FIG. 8 is a plan view illustrating an example of a pressure sensor device 1 according to Preferred Embodiment 3 of the present invention. In this preferred embodiment, as compared with the configuration in FIGS. 1A and 1B, the monitoring electrodes M2 and M4 provided in the left and right outer side portions (shorter side portions) of the sensing electrode S are omitted, and only the two monitoring electrodes M1 and M3 are provided in the upper and lower outer side portions (longer side portions) of the sensing electrode S. The mechanical and electrical configurations except these are the same or substantially the same as those in FIGS. 1A and 1B. With the configuration like this, the monitoring electrodes M1 and M3 can also detect the stress and/or strain applied to the spacer portion.

Preferred Embodiment 4

Figure 9:
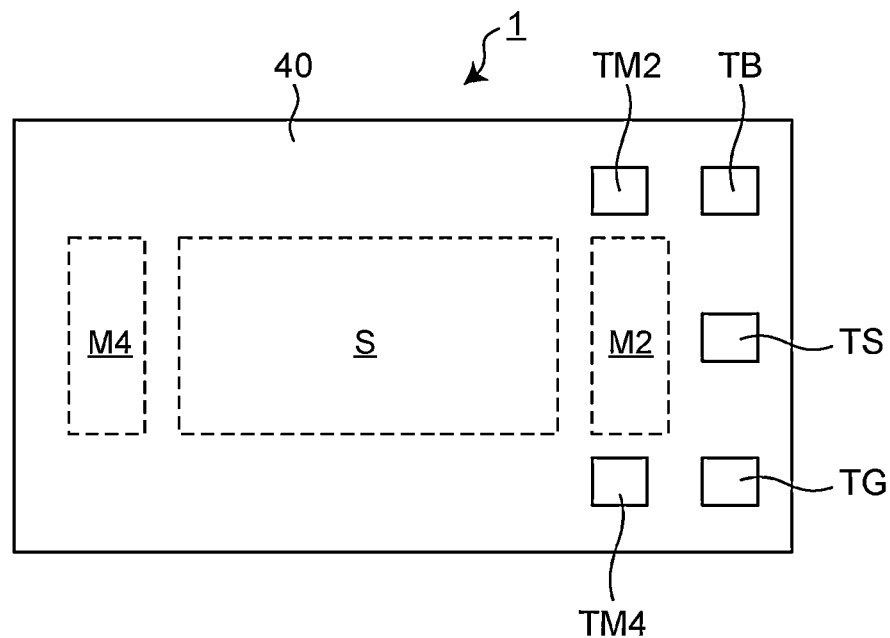
FIG. 9 is a plan view illustrating an example of a pressure sensor device 1 according to Preferred Embodiment 4 of the present invention.
Figure 10:
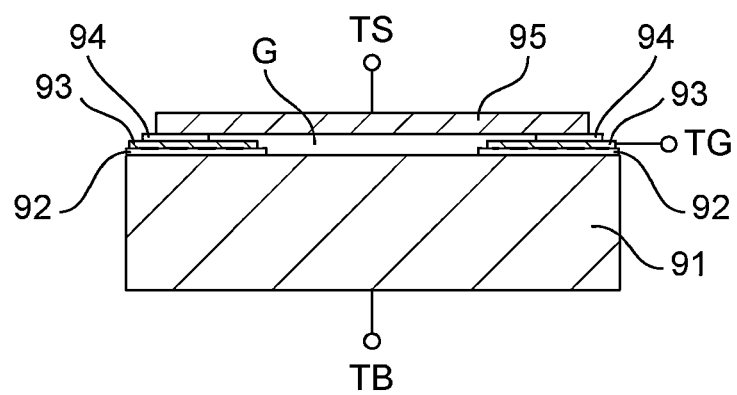
FIG. 10 is a cross-sectional view illustrating an example of a pressure sensor device in the related art.

FIG. 9 is a plan view illustrating an example of a pressure sensor device 1 according to Preferred Embodiment 4 of the present invention. In this preferred embodiment, as compared with the configuration in FIGS. 1A and 1B, the monitoring electrodes M1 and M3 provided in the upper and lower outer side portions (longer side portions) of the sensing electrode S are omitted, and only the two monitoring electrodes M2 and M4 are provided in the left and right outer side portions (shorter side portions) of the sensing electrode S. The mechanical and electrical configurations except these are the same or substantially the same as those in FIGS. 1A and 1B. With the configuration like this, the monitoring electrodes M2 and M4 can also detect the stress and/or strain applied to the spacer portion.

The cases where the four or two monitoring electrodes are provided around the sensing electrode have been described for the preferred embodiments above. However, instead of this, one, three, or five monitoring electrodes can be provided.

The cases where the sensing electrode and the monitoring electrodes are rectangular or oblong in the plan view have been described for the preferred embodiments above. However, instead of this, the sensing electrode and the monitoring electrodes may be a polygon such as a triangle, a pentagon, or a hexagon.

The present invention has been fully described related to preferable preferred embodiments with reference to the accompanying drawings, but various modifications and corrections can be made by those skilled in the art. It should be understood that such modifications and corrections are included within the scope of the invention without departing from the scope of the invention according to the appended claims.

Preferred embodiments of the present invention are industrially exceedingly useful because high measurement accuracy can be achieved even after mounting on the circuit board.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A pressure sensor device to detect a change in capacitance between electrodes, comprising:
    a base electrode portion;
    a sensing electrode portion defining a sensing capacitor together with the base electrode portion and that is deformable in response to an ambient pressure difference;
    a spacer portion maintaining a gap between the base electrode portion and the sensing electrode portion; and
    a monitoring electrode portion defining a monitoring capacitor together with the base electrode portion to detect at least one of stress or strain occurring in or on the spacer portion; wherein
    the sensing electrode portion includes a sensing electrode that is rectangular or oblong in a plan view; and
    the monitoring electrode portion includes first and second monitoring electrodes respectively provided in left and right outer side portions or in upper and lower outer side portions of the sensing electrode, and the first and second monitoring electrodes are separated from one another in the plan view.

2. The pressure sensor device according to claim 1, wherein a monitoring gap included in the monitoring capacitor is isolated from a sensing gap included in the sensing capacitor.

3. The pressure sensor device according to claim 1, further comprising an electrically insulative substrate on which the base electrode portion is provided.

4. The pressure sensor device according to claim 3, wherein the electrically insulative substrate includes silicon oxide.

5. The pressure sensor device according to claim 1, wherein the base electrode portion includes at least one of polycrystalline Si, amorphous Si, or single crystal Si.

6. The pressure sensor device according to claim 1, further comprising a membrane plate on which the sensing electrode portion and the monitoring electrode portion are provided.

7. The pressure sensor device according to claim 6, wherein the membrane plate includes at least one of silicon oxide and single crystal silicon.

8. A pressure sensor module comprising:
    the pressure sensor device according to claim 1; and
    an integrated circuit to process an output signal from the pressure sensor device; wherein
    the integrated circuit includes a switching circuit to perform switching between a sensing signal from the sensing electrode portion and a monitoring signal from the monitoring electrode portion;
    an A/D converter to convert an output signal from the switching circuit to a digital signal;
    a digital signal processor to perform signal processing on the digital signal; and
    a memory or a register to store a digital value of the monitoring signal.

9. The pressure sensor module according to claim 8, wherein a monitoring gap included in the monitoring capacitor is isolated from a sensing gap included in the sensing capacitor.

10. The pressure sensor module according to claim 8, further comprising an electrically insulative substrate on which the base electrode portion is provided.

11. The pressure sensor module according to claim 10, wherein the electrically insulative substrate includes silicon oxide.

12. The pressure sensor module according to claim 8, wherein the base electrode portion includes at least one of polycrystalline Si, amorphous Si, or single crystal Si.

13. The pressure sensor module according to claim 8, further comprising a membrane plate on which the sensing electrode portion and the monitoring electrode portion are provided.

14. The pressure sensor module according to claim 13, wherein the membrane plate includes at least one of silicon oxide and single crystal silicon.

15. A pressure sensor device to detect a change in capacitance between electrodes, comprising:
   a base electrode portion;
   a sensing electrode portion defining a sensing capacitor together with the base electrode portion and that is deformable in response to an ambient pressure difference;
   a spacer portion maintaining a gap between the base electrode portion and the sensing electrode portion; and
   a monitoring electrode portion defining a monitoring capacitor together with the base electrode portion to detect at least one of stress or strain occurring in or on the spacer portion; wherein
   the sensing electrode portion includes a sensing electrode that is rectangular or oblong in a plan view; and
   the monitoring electrode portion includes first, second, third, and fourth monitoring electrodes respectively provided in left, right, upper, and lower outer side portions of the sensing electrode, and the first, second, third, and fourth monitoring electrodes are separated from one another in the plan view.

16. A signal correction method for a pressure sensor module, the pressure sensor module including:
   a pressure sensor device to detect a change in capacitance between electrodes, including:
      a base electrode portion;
      a sensing electrode portion defining a sensing capacitor together with the base electrode portion and that is deformable in response to an ambient pressure difference;
      a spacer portion maintaining a gap between the base electrode portion and the sensing electrode portion; and
      a monitoring electrode portion defining a monitoring capacitor together with the base electrode portion to detect at least one of stress or strain occurring in or on the spacer portion; and
   an integrated circuit to process an output signal from the pressure sensor device; wherein
   the sensing electrode portion includes a sensing electrode that is rectangular or oblong in a plan view;
   the monitoring electrode portion includes first and second monitoring electrodes respectively provided in left and right outer side portions or in upper and lower outer side portions of the sensing electrode, and the first and second monitoring electrodes are separated from one another in the plan view;
   the integrated circuit includes a switching circuit to perform switching between a sensing signal from the sensing electrode portion and a monitoring signal from the monitoring electrode portion;
   an A/D converter to convert an output signal from the switching circuit to a digital signal;
   a digital signal processor to perform signal processing on the digital signal; and
   a memory or a register to store a digital value of the monitoring signal; and
   the method comprising:
      before mounting the pressure sensor module on a circuit board, measuring a capacitance of the monitoring capacitor and storing the capacitance as an initial capacitance value in the memory or the register;
      after mounting the pressure sensor module on the circuit board, measuring a capacitance of the monitoring capacitor and storing the capacitance as a post-mounting capacitance value in the memory or the register;
      calculating a strain correction coefficient based on the initial capacitance value and the post-mounting capacitance value; and
   measuring a capacitance of the sensing capacitor, and correcting the capacitance by using the strain correction coefficient, and thereafter converting the capacitance into a pressure value.

* * * * *